US010173892B2

(12) United States Patent
Deas et al.

(10) Patent No.: US 10,173,892 B2
(45) Date of Patent: Jan. 8, 2019

(54) INTEGRATED MEMS TRANSDUCER AND CIRCUITRY

(71) Applicant: Cirrus Logic International Semiconductor Ltd., Edinburgh (GB)

(72) Inventors: James Deas, Edinburgh (GB); Jean Lasseuguette, Edinburgh (GB); John Pennock, Edinburgh (GB); Mark Hesketh, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/329,164

(22) PCT Filed: Jul. 30, 2015

(86) PCT No.: PCT/GB2015/052195
§ 371 (c)(1),
(2) Date: Jan. 25, 2017

(87) PCT Pub. No.: WO2016/016648
PCT Pub. Date: Feb. 4, 2016

(65) Prior Publication Data
US 2017/0217757 A1    Aug. 3, 2017

(30) Foreign Application Priority Data
Jul. 31, 2014    (GB) .................... 1413631.1

(51) Int. Cl.
*H03K 5/1252* (2006.01)
*B81C 1/00* (2006.01)
*B81B 7/00* (2006.01)

(52) U.S. Cl.
CPC .......... *B81B 7/008* (2013.01); *B81C 1/00246* (2013.01); *H03K 5/1252* (2013.01); *B81B 2207/07* (2013.01)

(58) Field of Classification Search
CPC .... H03K 17/162; H03K 17/687; H03K 17/16; H03K 17/693; H03K 5/1252;
(Continued)

(56) References Cited

U.S. PATENT DOCUMENTS

2012/0170773 A1*   7/2012   Makabe ................ H03F 1/26
                                              381/120

FOREIGN PATENT DOCUMENTS

CN       102170605 A     5/2011
GB         2467776 A     8/2010
(Continued)

OTHER PUBLICATIONS

International Search Report and Written Opinion of the International Searching Authority, International Application No. PCT/GB2015/052195, dated Nov. 6, 2015.
(Continued)

*Primary Examiner* — John W Poos
(74) *Attorney, Agent, or Firm* — Jackson Walker L.L.P.

(57) ABSTRACT

This application relates to an integrated circuit die (200) comprising a MEMS transducer structure (101) integrated with associated electronic circuitry (102). The electronic circuitry comprises a plurality of transistors and associated interconnections and is formed in a first area (103) of the die from a first plurality (104) of layers, e.g. formed by CMOS metal (107) and dielectric (108) layers and possibly doped areas (106) of substrate (105). The MEMS transducer structure is formed in a second area (111) of the die and is formed, at least partly, from a second plurality (112) of layers which are separate to the first plurality of layers. At least one filter circuit (201) is formed from said second plurality of layers overlying the plurality of transistors of the electronic circuitry (102). The second plurality of layers comprise at least a first metal layer (115, 117) which is patterned to form a first
(Continued)

electrode of the MEMS transducer and at least a resistor, capacitor electrode or inductor element (203a, 203b) of the filter circuit.

19 Claims, 6 Drawing Sheets

(58) Field of Classification Search
CPC ........ B81B 2207/012; B81B 2207/096; B81B 3/0027; B81B 7/007; B81B 7/0064
USPC ........................................................ 327/311
See application file for complete search history.

(56) References Cited

FOREIGN PATENT DOCUMENTS

| | | |
|---|---|---|
| GB | 2467776 A8 | 8/2010 |
| WO | 2004077073 A1 | 9/2004 |

OTHER PUBLICATIONS

Combined Search and Examination Report under Sections 17 and 18(3), United Kingdom Application No. GB1413631.1, dated Jan. 26, 2015.
First Examination Report, Taiwan Application No. 104124934, dated Jul. 7, 2016.
Examination Report under Sections 17 and 18(3), UKIPO, Application No. GB1413631.1, dated Nov. 10, 2017.

* cited by examiner

INTEGRATED MEMS TRANSDUCER AND CIRCUITRY

This invention relates to integrated MEMS transducers having a MEMS transducer structure integrated with associated circuitry on a monolithic die, and to methods of fabricating such integrated MEMS transducers.

Consumer electronics devices are continually getting smaller and, with advances in technology, are gaining ever increasing performance and functionality. This is clearly evident in the technology used in consumer electronic products such as mobile phones, laptop computers, MP3 players and tablets. Requirements of the mobile phone industry, for example, are driving the components to become smaller with higher functionality and reduced cost. It is therefore desirable to integrate functions of electronic circuits together and combine them with transducer devices such as microphones and speakers.

The result of this is the emergence of Micro-Electrical-Mechanical-Systems (MEMS) based transducer devices. These may be, for example, capacitive transducers for detecting and/or generating pressure/sound waves or transducers for detecting acceleration. MEMS capacitive microphones typically comprise a first electrode, which is moveable with respect to a second fixed electrode in response to incident acoustic waves. The first electrode may, for example, be supported by a flexible membrane. By measuring changes in the capacitance between the electrodes the incident acoustic signals can be detected. In use the electrodes of the MEMS microphone may be biased by biasing circuitry and the measurement signal may be amplified by amplifier circuitry such as a low-noise amplifier.

To date most MEMS capacitive transducers have been fabricated as a separate component to the electronic circuitry for operating the transducer, e.g. the biasing circuitry and amplifier circuitry for a MEMS microphone. In other words the MEMS transducer structure is fabricated on a first substrate, e.g. a first chip or die, with suitable connections for connecting to the associated electronic circuitry on a separate substrate, e.g. a second chip or die.

It has long been proposed to integrate the MEMS transducer structure and the associated electronic circuitry onto a single monolithic transducer die, i.e. so that the MEMS structure and associated circuitry, e.g. biasing circuitry and/or amplifier circuitry, are fabricated on the same chip. This can have the advantage of providing a reduction in size compared to have two separate chips. It also avoids the need for connections such as bond pads and wire bonds in the signal path between the MEMS transducer and the amplifier circuitry which could introduce unwanted parasitic capacitances and/or inductances and resulting signal loss.

The electronic circuitry associated with operation of the transducer, e.g. biasing circuitry and/or amplifier circuitry, will typically comprise a plurality of transistors and interconnections. This circuitry may be fabricated by using standard integrated circuit processing techniques, for instance CMOS processing.

As mentioned above, MEMS transducers are increasingly being used in portable devices with communication capability, e.g. mobile telephones or the like. Such devices will include at least one antenna for transmitting RF signals. The amount of power transmitted by such devices can be relatively high and is set to increase with changes to the communication standards. This can cause a problem for MEMS transducers, such as microphones, with CMOS circuitry. The transmitted RF signals can be coupled to the CMOS circuitry and, as the CMOS circuitry is inherently non-linear, such signals may be demodulated to the audio band. This may therefore result in audible noise such as the so-called "bumblebee noise". This problem may be exacerbated when using MEMS microphones with integrated CMOS circuitry as in many devices the position of the antenna happens to be close to the position where the microphone is required.

The MEMS microphone package may be shielded, for instance surrounded by grounded conductive material for EMI shielding but coupling of RF noise into MEMS transducer circuitry remains a problem.

Embodiments of the present invention therefore provide integrated MEMS transducers that at least mitigate at least some of the above mentioned problems.

According to the present invention there is provided a MEMS transducer die comprising:
  first circuitry comprising a plurality of transistors and their interconnections formed in a first area of the die from a first plurality of layers;
  a MEMS transducer structure formed in a second area of the die, the MEMS transducer structure being formed at least partly from a second plurality of layers which are separate to the first plurality of layers, the second plurality of layers comprising at least a first metal layer; and
  at least one filter circuit formed from said second plurality of layers overlying said plurality of transistors;
  wherein said first metal layer is patterned to form a first electrode of the MEMS transducer and at least a resistor, capacitor electrode or inductor element of the filter circuit.

The second plurality of layers may further comprise a second metal layer, wherein the second metal layer is patterned to form a second electrode of the MEMS transducer and at least a part of the filter circuit. The second plurality of layers may further comprise a third metal layer, wherein the third metal layer is patterned to form at least part of a conductive path between an electrode of the MEMS transducer and the first circuitry and is also patterned to form at least a part of the filter circuit.

In some embodiments the second plurality of layers may further comprise at least one layer that acts as an insulator for the transducer structure in the second area of the die and an insulator for the filter circuit in the first area of the die. In some embodiments the filter circuit comprises a capacitor and the second plurality of layers comprises at least a first dielectric layer which forms part of the transducer structure in the second area of the die and at least part of a dielectric of the capacitor of the filter circuit in the first area of the die.

The MEMS transducer die may comprise a cavity in the first plurality of layers in the second area to provide at least part of an acoustic volume for said MEMS transducer.

In some embodiments the filter circuit comprises a passive filter circuit, for example a resistive-capacitive filter. The filter circuit may be connected between a first terminal of the die and the first circuitry to filter any noise above a corner frequency of greater than 1 MHz at the first terminal.

The filter circuit may comprise a first filter network connected in a conductive path between an output terminal of the die and an output of the first circuitry. The first circuitry may comprise an amplifier circuit and the output of the first circuitry may be an output of said amplifier circuit. The filter circuit may additionally or alternatively comprise a second filter network connected in a conductive path between a voltage supply terminal to the die and a first input of the first circuitry. The first circuitry may comprise biasing circuitry and the first input of the first circuitry may be a supply input to said biasing circuitry. The filter circuit may comprise a third filter network connected in a conductive path between the output of the second filter network and a second input of the first circuitry. The second input of the first circuitry may be a supply input to an amplifier circuit. In some embodiments the transducer die may comprise a conductive path between the voltage supply terminal to the die and a third input of the first circuitry which does not include said second filter circuit. The first circuitry may comprise a trimming circuit for trimming a bias voltage and the third input of the first circuitry may be a supply input to said trimming circuit. In some embodiments the filter circuit may comprise a fourth filter network connected in the conductive path between said voltage supply terminal and the third input of the first circuitry, wherein the fourth filter network is configured to provide less filtering than the second filter network.

The filter circuit may comprise at least one capacitor wherein the first metal layer forms a first capacitor electrode for the at least one capacitor in the first area of the die. The first capacitor electrode may be connected via a conductive path to a ground terminal of said transducer die. The first metal layer may form the bottom electrode of the MEMS transducer structure. In some embodiments the majority of the first area overlying the plurality of transistors is provided with the first metal layer.

In some embodiments the second metal layer mentioned above may form a second capacitor electrode for the at least one capacitor in the first area of the die.

The first metal layer may form the membrane electrode of the transducer structure in the second area of the die.

The filter circuit may comprise a resistor. In which case the third metal layer mentioned above may form at least part of the resistor. The resistor may comprise a conductive path with a serpentine configuration.

The MEMS transducer structure may be a MEMS capacitive microphone structure.

Embodiments also relate to electronic devices comprising a MEMS transducer die as described in any of the variants above. The device may be at least one of: a portable device; a battery powered device; a computing device; a communications device; a gaming device; a mobile telephone; a personal media player; a laptop, tablet or notebook computing device.

In another aspect there is provided a method of forming a MEMS transducer die comprising:
  forming a first plurality of layers on a substrate to form first circuitry comprising a plurality of transistors and their interconnections in a first area of the die,
  forming a second plurality of layers on the first plurality of layers to form at least part of a MEMS transducer in a second area of the die and at least part of a filter circuit overlying said plurality of transistors in the first area of the die, wherein
    forming the second plurality of layers comprises forming at least a first metal layer and patterning said first metal layer to form an electrode of the MEMS transducer structure in the second area of the die and at least a resistor, capacitor electrode or inductor element of the filter circuit in the first area of the die.

In a further aspect there is provided a MEMS transducer die comprising: a filter circuit electrically connected to a first terminal of the transducer die for filtering noise at said first terminal; and a MEMS transducer structure formed in a second area of the die; wherein a first metal layer is patterned to form a first electrode of the MEMS transducer and also at least part of the filter circuit.

The MEMS transducer die may comprise additional circuitry, wherein the additional circuitry is formed from a plurality of layers which are separate from any layers forming said filter circuit. The filter circuit may overlie the additional circuitry.

IN a further aspect there is provided a MEMS transducer die comprising: a first plurality of layers; and a second plurality of layers on the first plurality of layers; wherein the die comprises: first circuitry comprising a plurality of transistors formed in a first area in the first plurality of layers; filter circuitry formed in the first area in the second plurality of layers; a transducer structure formed in a second area in the second plurality of layers; and a cavity formed in the first plurality of layers within the second area; wherein the second plurality of layers comprises a first metal layer that forms at least part of the filter circuitry in the first area and an electrode of the transducer structure in the second area.

In a further aspect there is provided a monolithic semiconductor die comprising:
first and second areas; a MEMS transducer formed within said first area comprising a plurality of layers; electronic circuitry coupled to said MEMS transducer and formed within said second area; and filter circuitry coupled to said electronic circuitry and formed above said electronic circuitry; wherein said filter circuitry comprises said at least one layer from said plurality of layers.

In a further aspect there is provided a semiconductor wafer comprising a plurality of die regions, each die region comprising: first and second areas; a MEMS transducer formed within said first area comprising a plurality of layers; electronic circuitry coupled to said MEMS transducer and formed within said second area; and filter circuitry coupled to said electronic circuitry and formed above said electronic circuitry wherein said filter circuitry comprises at least one layer from said plurality of layers.

For a better understanding of the present invention, and to show how it may be put into effect, reference will now be made, by way of example, to the following drawings in which.

DESCRIPTION

Figure 1:
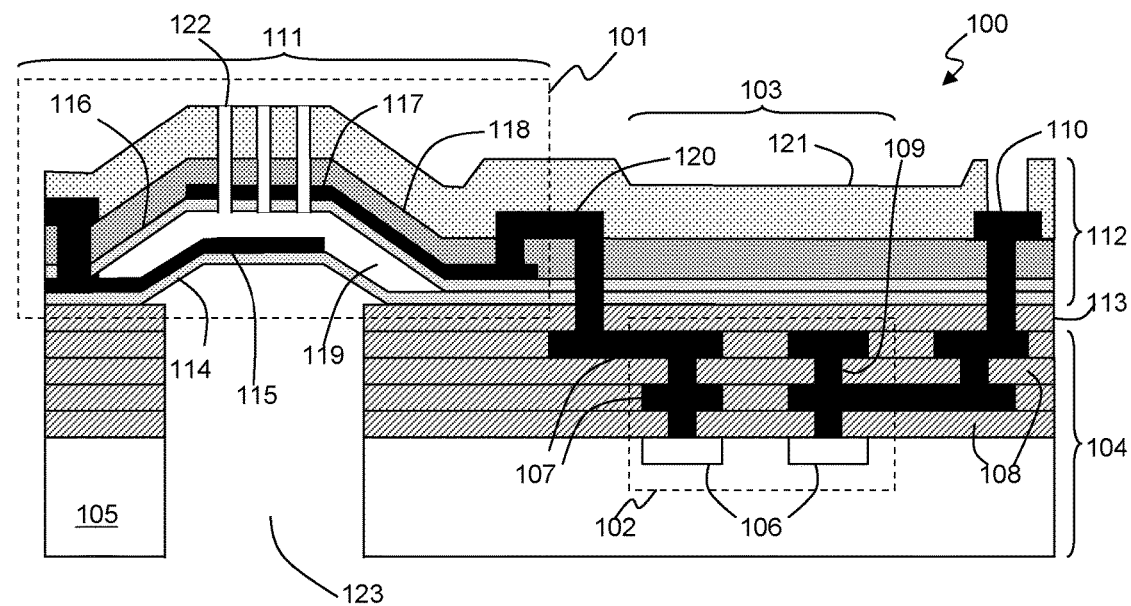
FIG. 1 shows a capacitive MEMS transducer with integrated circuitry.

The examples described below will be described in relation to integration of a MEMS microphone with integrated CMOS circuitry but it will be appreciated that the general teaching applies to other capacitive MEMS transducers such as for example loudspeakers and pressure sensors.

Embodiments of the present invention provide a die, i.e. a chip, which will be referred to herein as a transducer die, comprising a MEMS transducer structure integrated with first circuitry which is associated with operation of the MEMS transducer, e.g. a plurality of transistors and their interconnections formed on the same chip as the MEMS transducer structure. The first circuitry may for instance comprise transducer biasing circuitry and/or amplifier circuitry. In embodiments of the present invention the transducer die also comprises at least one filter circuit for filtering of conductive RF radiation, i.e. RF noise that is conducted into MEMS transducer die via electrical connections such as bond pads for connecting the first circuitry with external components. In embodiments of the invention the first circuitry, i.e. the plurality of transistors, which may comprise CMOS circuitry, may be formed in a first area of the die and the MEMS transducer structure may be formed in a second, different area of the die. The first circuitry may be formed from a first plurality of layers and the MEMS transducer may be formed at least partly from a second plurality of layers which are separate to the first plurality of layers. The second plurality of layers includes at least one metal layer which is patterned to form an electrode of the MEMS transducer structure and also at least part of the filter circuit, for instance at least part of a resistor, a capacitor or an inductor of the filter circuit. The filter circuit may be formed in the first area of the die and thus may at least partly overlie the first circuitry, i.e. at least some of the plurality of transistors of the first circuitry.

Embodiments of the present invention thus relate to transducer dies having a MEMS transducer structure integrated with a plurality of transistors for forming first circuitry associated with operation of the transducer.

As mentioned previously the first circuitry may be formed be any suitable processing technique, for instance by CMOS processing. As the skilled person will appreciate that in its more basic form CMOS circuitry is formed by depositing appropriate metal and inter-metal dielectric (IMD) or inter layer dielectric (ILD) materials, possibly over appropriately doped regions of the substrate.

In general the requirements with regard to the materials used to form the CMOS circuitry, i.e. the choice of material for the various layers and the layer thicknesses, tolerances etc, may be quite different from those for the MEMS transducer structure. In other words the material properties, dimensions and tolerances required for the CMOS circuitry may be quite different to those of the MEMS transducer. For example the MEMS transducer may have a flexible membrane carrying a membrane electrode. The material properties of the membrane and membrane electrode need to be selected to provide the required degree of flexibility whilst also being sufficiently resilient. These material requirements may be quite different to those required for CMOS circuitry forming a plurality of transistors.

Therefore the first circuitry, e.g. biasing circuitry and/or amplifier circuitry may be formed in a first area of the transducer die from a first plurality of layers which may be selected according to the requirements of the circuitry. The MEMS transducer structure is then formed in a second, different area of the die, at least partly from a second plurality of layers which are separate from the first plurality. This means that the second plurality of layers may be selected according to the material requirements of the transducer structure.

FIG. 1 illustrates a MEMS transducer die 100 having a MEMS transducer structure 101 integrated with associated first circuitry 102. The first circuitry comprises a plurality of transistors and their interconnections and is designed to provide a function in use associated with operation of the MEMS transducer. For example the first circuitry may comprise amplifier circuitry for amplifying a measurement signal from the MEMS transducer and/or other signal conditioning circuitry. Additionally or alternatively the first circuitry may comprise biasing circuitry for biasing the MEMS transducer, for example charge pump circuitry.

The first circuitry is formed in a first area 103 of the die. As used herein the term area of the die shall be taken to mean an area of the die as seen from a direction which is substantially perpendicular to the general plane of the die. Thus the area of the die refers to an area of the die in a "plan view" of the die (where FIG. 1 represents a cross section through the die).

As mentioned above the first circuitry is formed from a first plurality of layers 104. These layers may includes a substrate 105, which may be doped in certain areas 106 and, in this example may comprise a number of CMOS metal layers 107 and CMOS dielectric layers 108. The CMOS metal layers 107 may be formed from the same materials as one another or at least some CMOS metal layers may be formed from different materials from one another. The CMOS metal layers are patterned, together with any doped areas of substrate 106, e.g. wells, sources, drains etc. to form a plurality of transistors and possibly other components to provide the desired functionality as will be well understood by one skilled in the art. At least some CMOS metal layers may be separated by CMOS dielectric layers 108 and some metal layers may be connected to another by conductive vias 109 through the CMOS dielectric layers 108. Again the various CMOS dielectric layers 108 may be formed from the same material or from different materials from one another as required. One skilled in the art will be well aware of various CMOS processing techniques that can be used to form the required CMOS circuitry. At least some of the CMOS metal layers 107 may also be patterned so as to form interconnects for connecting to the electrodes of the transducer structure and/or for connection to contact terminals 110 for the transducer die, such as bond pads or the like.

The MEMS transducer structure 101 is formed in a second area 111 of the transducer die. The transducer structure is formed, at least partly, from a second plurality of layers 112. In this example the first plurality of layers 104 is formed on or including the substrate 105 and the second plurality of layers 112 is formed over the first plurality of layers 104. As used in this specification references to a layer being above or on top of another layer shall be taken to mean further away from the base substrate, i.e. towards the top of the page as shown in FIG. 1. References to below or beneath shall mean the opposite. The terms overlying and underlying shall also be construed accordingly. For the avoidance of doubt however these terms do not in any way imply requirement for the orientation of the transducer die in use or during any stage of fabrication.

The second plurality of layers 112 may be formed directly on top of a layer 113 which may for instance by a dielectric layer of the first plurality of layers or a passivating or buffer layer which is not necessarily part of the first plurality of layers and which is included to provide a suitable base for the second plurality of layers.

In this example the MEMS transducer structure comprises a membrane layer 114 which is supported with respect to the underlying layers so as to be flexible in use. A first MEMS metal layer 115 is patterned to form a membrane electrode supported by the flexible membrane.

In this example the MEMS transducer structure also comprises a backplate structure comprising a first backplate dielectric layer 116, a second MEMS metal layer 117 which is patterned to form a backplate electrode and a second backplate dielectric layer 118. The backplate structure supports the backplate electrode in fixed relation to the membrane electrode so as to define a cavity 119 between the membrane and the backplate at the quiescent membrane position. One skilled in the art will be aware of how such a MEMS transducer structure may be formed, for instance using sacrificial material to define a cavity between the membrane and underlying layers and also the cavity 119.

A third MEMS metal layer 120 is used to form a conductive path from the membrane electrode and the backplate electrode to the first circuitry. The third MEMS metal layer may also be used to form the terminals, e.g. bond pads, for the transducer die.

One or more protective or passivating layers 121 may be deposited on top of the third MEMS metal layer for protection. The backplate will typically comprise a number of acoustic holes or channels 122 formed running through the backplate (e.g. layers 116, 117, 118 and 122) in the area of the membrane so that the cavity 119 is in acoustic communication with a volume above the backplate. A cavity 123 is etched through the substrate 105 and all intervening layers under the membrane to form at least part of an acoustic volume on the lower side of the membrane. The requirement for the cavity 123 is part of the reason why the transducer structure 101 is formed in a different area of the transducer die to the first circuitry 102.

As mentioned above integrated an transducer die such as described above with reference to FIG. 1 is advantageous in allowing a reduced footprint, i.e. a smaller area, compared with the conventional approach of a separate chips for the MEMS transducer structure and the first circuitry respectively. In addition amplifier circuitry can be located close to the MEMS transducer and electrically connected without the need for relatively large bond pads and the like which can degrade transducer performance through unwanted parasitic capacitances and the like. However as also mentioned the use of such transducer dies, especially in mobile telephones where the transducer die is located in close proximity to an RF antenna, can lead to problems with RF noise being demodulated into the audio band or other band of interest for the relevant transducer.

The transducer die may be packaged in a package (not illustrated) which is at least partly shielded to prevent radiated RF from directly coupling to the CMOS circuitry, e.g. radiated RF noise. However it has been appreciated that, in use, conduction of RF noise into the transducer package and to the circuitry of the transducer die can occur via the electrical contacts with external components. In embodiments of the present invention therefore the transducer die includes at least one filter circuit for filtering such conductive RF noise.

Figure 2:
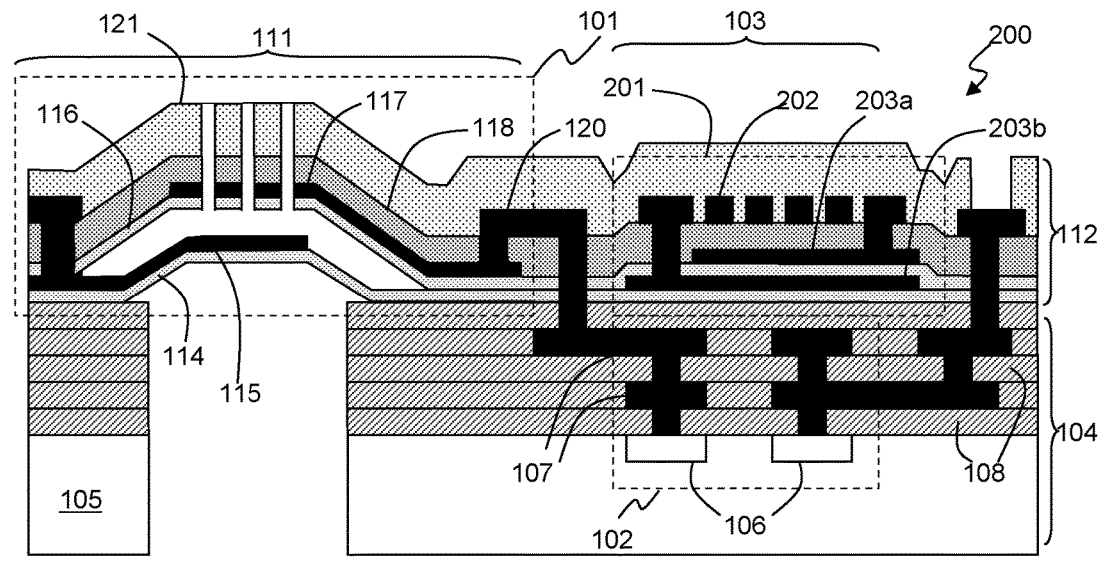
FIG. 2 illustrates an integrated MEMS transducer and circuitry arrangement according to an embodiment of the invention

FIG. 2 illustrates a transducer die 200 according to an embodiment of the invention. The transducer die 200 comprises first circuitry 102 formed in a first area 103 of the transducer die from a first plurality of layers 104 as described above in relation to FIG. 1. The transducer die 200 also comprises a transducer structure 101 formed in a second area of the die 111 from at least a second plurality of layers 112 as described above in relation to FIG. 1. The transducer die 200 also comprises filter circuitry 201 which forms at least one filter circuit for filtering conductive RF noise received at the electrical connections to the transducer die 200. The filter circuit 201 is formed at least partly by at least one of the metal layers used to form the MEMS structure and in particular one of the MEMS metal layers used to form an electrode of the MEMS transducer. The metal layer is used to form at least part of a resistor, a capacitor or an inductor of the filter circuit, i.e. a component that is deliberately introduced to provide a desired resistance, capacitance or inductance as part of a specific filter. It will be appreciated that metal interconnects for instance may be associated with a parasitic capacitance or inductance. In embodiments of the present invention however the relevant metal layer is patterned to form part of a resistive, capacitive or inductive component that provides more than simply parasitic capacitance or inductance.

In the embodiment illustrated in FIG. 2 the filter circuit is a passive RC filter circuit comprising a resistor 202 and a capacitor 203. In this example the resistor is formed from the third MEMS metal layer 120 which is used to form the interconnects between the MEMS electrode layers and the first circuitry. In this example the capacitor comprises capacitor plate 203a which is formed from the second MEMS metal layer 117 used to form the backplate electrode and capacitor plate 203b which is formed from the first MEMS metal layer 115 used to form the membrane electrode. In this example the capacitor plates 203a and 203b are separated by backplate layer 116 and the resistor 203 is separated from the capacitor by 203 by backplate layer 118. The resistor and capacitor are connected by the third MEMS metal layer 120. The filter circuit is protected by the uppermost passivation layer(s) 121.

It can therefore be seen that a metal layer of the second plurality of layers 112 which is patterned to form an electrode of the MEMS transducer, e.g. layer 115 or 117, is also patterned to form a component of the filter circuit. It will also be seen that at least one layer that acts as an insulator or dielectric for the transducer structure in the second area of the die may also provide an insulator or dielectric for the filter circuit in the first area of the die. For example backplate layer 114 which forms part of the transducer structure in the second area of the die may be a dielectric layer and may also serve as a dielectric for the capacitor formed by capacitor plates 203a and 203b. Likewise backplate layer 116 provides insulation between capacitor plate 203a and resistor 202 as well as forming part of the MEMS transducer structure.

It will of course be appreciated that a layer of the second plurality of layers which forms parts of the MEMS transducer structure and also a component of the filter circuit may have been patterned to be discontinuous. For example the first MEMS metal layer 115 which forms the membrane electrode and also a capacitor plate 203b may be discontinuous across the layer. As use herein the term layer therefore refers to any instances of the same material that was deposited or formed at the same time and thus appears in the same order in the stack of materials at different places.

Figure 3:
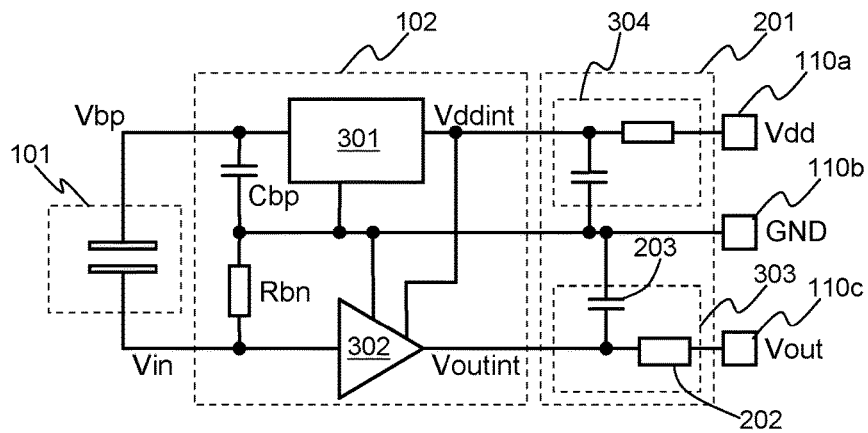
FIG. 3 illustrates a circuit diagram of a MEMS transducer die according to an embodiment of the invention.

One example of the how filter circuitry may be implemented is illustrated in FIG. 3 which illustrates a circuit diagram of the transducer die including the filter circuitry. It will be appreciated that this figure illustrates the circuit connections and does not represent the actual physical layout of the components. A MEMS capacitive transducer $C_m$ is formed from the membrane electrode, i.e. metal layer 115, and the backplate electrode, i.e. metal layer 117.

The CMOS circuitry 102 is arranged for operation of the MEMS transducer. In the example of FIG. 3 the circuitry includes biasing circuitry which comprises a charge pump circuit 301 for generating a biasing voltage Vbp, for example 12V, for biasing one electrode of the capacitive transducer from a voltage supply Vdd received from a voltage supply terminal, e.g. bond pad, 110a. A biasing capacitor Cbp may also be arranged between the output of the charge pump and a ground line connected to a ground terminal 110b. The other electrode of the transducer is biased to another fixed voltage, typically ground GND, via a very high impedance $R_{bn}$, for example, in the order of 10 GΩ. Any changes in the capacitance cause a signal voltage $V_{in}$ at this node of the transducer.

The circuitry 102 also comprises an amplifier 302 for amplifying the measurement signal Vin from the MEMS capacitor $C_m$. The amplifier 302 produces an amplified signal Voutint which is supplied in use to an output terminal 110c as an output signal Vout.

In the example illustrated in FIG. 3 the filter circuitry 201 comprises a first resistive-capacitive (RC) filter 303 located between the output terminal 110c and the output of the amplifier 302. The RC filter 303 comprises a resistor 202 connected in series in the signal path and a capacitor 202 coupled between a node of the signal path and ground GND. The RC filter 303 acts to filter any RF noise that is conductively coupled into the signal path via output terminal 110c.

A second RC filter 303 is located between the supply terminal 110a and the input to the charge pump circuit 301. This filter again comprises a resistor 202 in series in the signal path and a capacitor 203 coupled between the signal path and ground. The charge pump 301 thus receives a filtered supply voltage Vddint.

The RC filters 303 and 304 are located such that RF signals, for instance such as produced by an antenna in a phone, which may couple onto the output node 110c or the supply node 110a, are at least partly filtered before they can be passed through into the CMOS circuitry 102. The filter circuit may be arranged to have a corner frequency of at least 1 MHz. In some embodiments the cornet frequency may be of the order of 100 MHz or so, for example to filter RF noise at around 2 GHz.

It will be appreciated that in some embodiments of the invention only one of the filter circuits 303 or 304 will be present and that in other embodiments there may be other filter circuits. It will also be appreciated that in the example of FIG. 3 the filter circuit is a passive RC filter. Other filter arrangements may be used however, for instance a filter circuit could comprise one or more capacitors without any resistors or one more resistors without any capacitors. Additionally or alternatively a filter circuit may comprise inductors.

Referring back to FIG. 2 it can be seen that the capacitor (s) 203 of the filter circuit(s) may be formed from the first and second MEMS metal layers 115 and 117 which are used to form the electrodes of the MEMS capacitive transducer. The resistor(s) 202 of the filter circuit(s) are formed from the third MEMS metal layer 120 used for interconnection. The resistor 202 may be formed by simply patterning the metal to form a relatively long conductive path. This may be achieved for instance by forming a serpentine path, i.e. a winding path, from the third MEMS metal layer in the first area of the transducer.

In the example illustrated with respect to FIG. 3 it can therefore be seen that the filter circuit is formed using layers of the second plurality of layers 112 that would be present in any case for the transducer structure. Thus the filter circuit can be formed without requiring any additional material layers compared to the transducer die illustrated with respect to FIG. 1. The filter circuitry 201 is formed in the second plurality of layer in the first area 103 of the transducer die. Thus the filter circuitry overlies the first circuitry 102, i.e. it overlies at least some of the transistors and their interconnects that form at least part of the first circuitry. This has the advantage that the filter circuitry is formed in substantially the same area of the transducer die as the first circuitry and thus need not significantly add to the overall area of the transducer die, i.e. the footprint of the transducer. In some embodiments therefore the filter circuitry may be fabricated using the same general process steps FIGS. 4a-h illustrate one example of a method of fabrication of the transducer die illustrate in FIG. 2.

First the necessary CMOS circuitry 102 is fabricated in a first area of the die by forming one or more CMOS metal layers 107 and one or more CMOS dielectric layers 108 on a substrate 105 to form circuitry comprising at least a plurality of transistors. The substrate may have one or more doped areas 106 and some of the CMOS metal layers may be joined by vias 109. The CMOS circuitry may be formed using standard processing techniques such as ion implantation, photomasking, metal deposition and etching. The circuitry may, without limitation, comprise some or all of amplifier circuitry, voltage biasing circuitry, analogue to digital convertors and/or digital to analogue convertors, oscillator circuitry, voltage reference circuitry, current reference circuitry and charge pump circuitry. The circuitry is fabricated such that dielectric layers 108 are deposited over the area where the transducer is later to be fabricated.

It will be appreciated that the circuitry layers will actually be varied across the circuitry region of substrate to form distinct components and interconnections between components. The circuitry layers illustrated in FIG. 4a, and in the all the following examples, are for illustration purposes only. For the purposes of explaining the invention the contacts between different parts of the circuitry and the membrane and back-plate electrodes will be shown but the skilled person will appreciate that the respective connections may in practice be in separate regions of the device. Further in all of the examples a three metal layer CMOS circuitry arrangement is shown for purposes of illustrating the invention but the skilled person will be aware of other arrangements that may be used. The CMOS circuitry is thus formed from the first plurality of layers.

It will of course be appreciated that at least some individual layers of the first plurality of layers may be patterned and thus will not extend over the whole area of the transducer die and for instance may not be present in the area of the die where the transducer structure is to be fabricated. Also the layers may not be planar due to differences in underlying layers.

The MEMS transducer structure is then fabricated on the first plurality of layers. The base for forming the MEMS transducer structure may be a layer 113 which may, for instance be a CMOS dielectric layer.

Figure 4A:
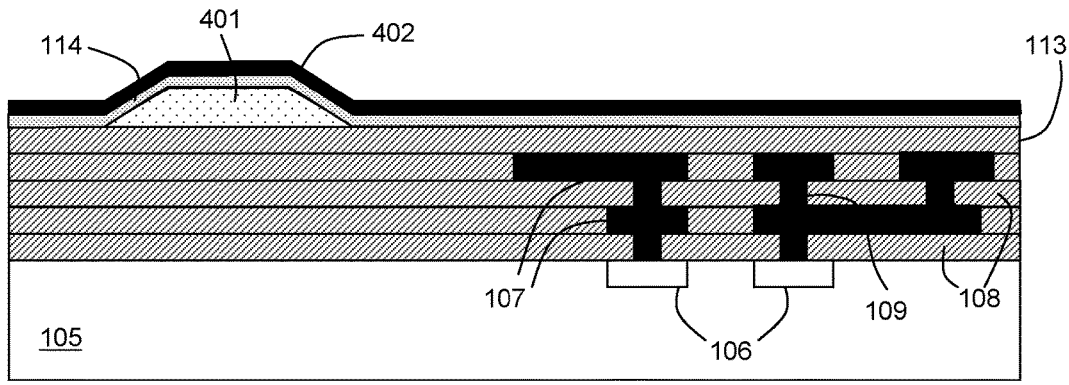
FIGS. 4a-4h illustrate the processing steps involved in one example of a method for fabricating the integrated transducer and circuitry arrangement shown in FIG. 2.

As shown in FIG. 4a, a first layer of sacrificial material such as polyamide is then deposited on transducer base layer 113 and possibly etched to a desired thickness, for example in the range of 1-5 μm. The polyamide layer may then be patterned to leave a shaped sacrificial layer 401 which will define the membrane that will be left behind when the sacrificial layer is later removed. The polyamide layer 401 may also later act as an etch stop for a back-side etch as will be described.

Next a membrane layer 114 is deposited over the base layer 113 and sacrificial layer 401. In a preferred embodiment the membrane layer 114 comprises silicon nitride and may, for example, be deposited using a plasma enhanced chemical vapour deposition (PECVD) process. The membrane layer defines the thickness of the flexible membrane and thus this layer should be relatively thin, for example, around 0.4 μm. A first MEMS metal layer 402 is then deposited on top of the membrane layer. The first MEMS metal layer is the layer which patterned to form the membrane electrode. The first MEMS metal layer is preferably relatively thin to avoid directly stiffening the membrane through its extra thickness and also reduce the amount of any compressive stress imparted by the metal layer post manufacture. The thickness of the first MEMS metal layer 402 may be, for example around 0.05 µm. The membrane layer will also be patterned to have a plurality of relief holes (not shown) for low frequency pressure equalisation across the membrane in use.

Figure 4B:
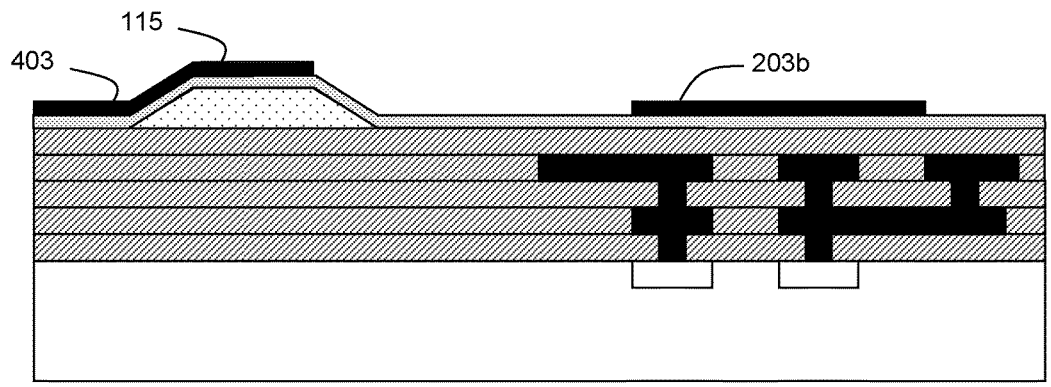

As shown in FIG. 4b this first MEMS metal layer is then patterned to form the membrane electrode layer 115, which comprises the membrane electrode itself connected via an interconnection track to contact pad 403. The first MEMS metal layer is also patterned at the same time to form at least one capacitor plate 203b, which will form part of the filter circuitry 102, possibly with conductive paths to a contact pad.

Figure 4C:
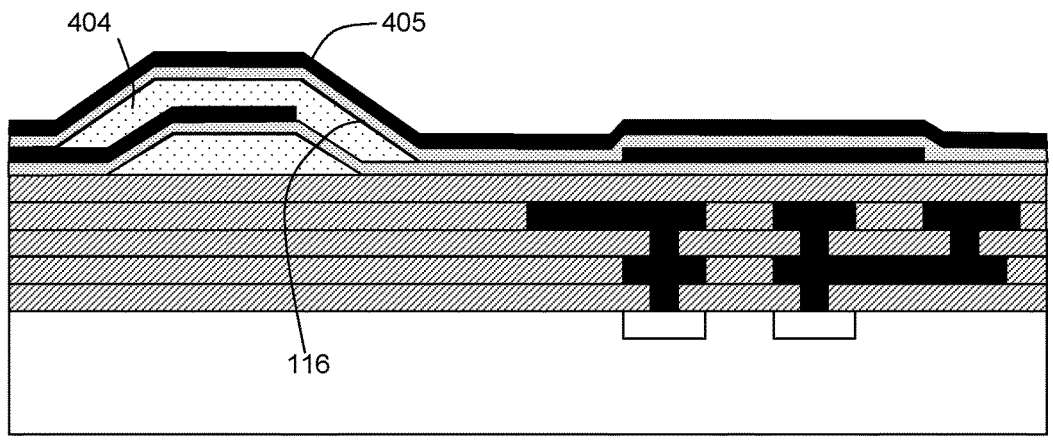

As illustrated in FIG. 4c further layer of sacrificial material 404 such as polyamide is then deposited and patterned over the area intended to form the membrane to define the cavity between the membrane and the backplate of the transducer structure. The thickness of the layer of sacrificial material 404 may be, for example, about 2.2 µm.

A first back-plate layer 116 is then deposited over the patterned first MEMS metal layer and layer of sacrificial material 404. This first back-plate layer may conveniently comprise the same material as the membrane layer 114 such as silicon nitride. The first back-plate layer 116 may be deposited by PECVD to a thickness of, for example about 0.15 µm. The first back-plate layer 116 is used to provide insulation on the underside of the back-plate, but preferably is relatively thin so as not to increase the spacing between the transducer electrode and thus reduce the capacitance of the transducer. Next, a second MEMS metal layer 405 is deposited. The second MEMS electrode layer may conveniently be formed from the same metal as the membrane electrode layer 115, such as aluminium, is deposited and it may be around 0.1 µm thick.

Figure 4D:
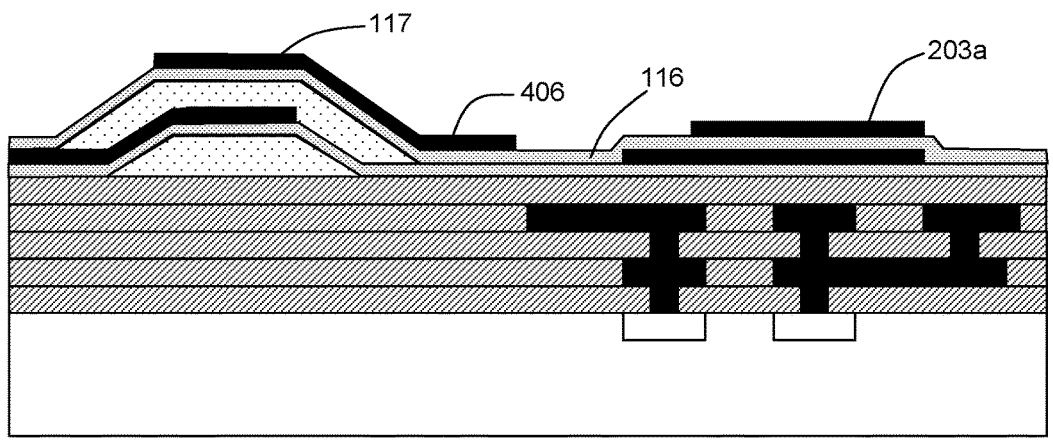

As illustrated in FIG. 4d the second MEMS metal layer 405, is then patterned to form the back-plate electrode layer 117, connected via an interconnection track to contact pad 406, and at least one further capacitor plate 203a which will form part of the filter circuitry 226. The backplate electrode may be patterned to remove the second MEMS metal layer from areas that will form acoustic channels through the backplate.

Figure 4E:
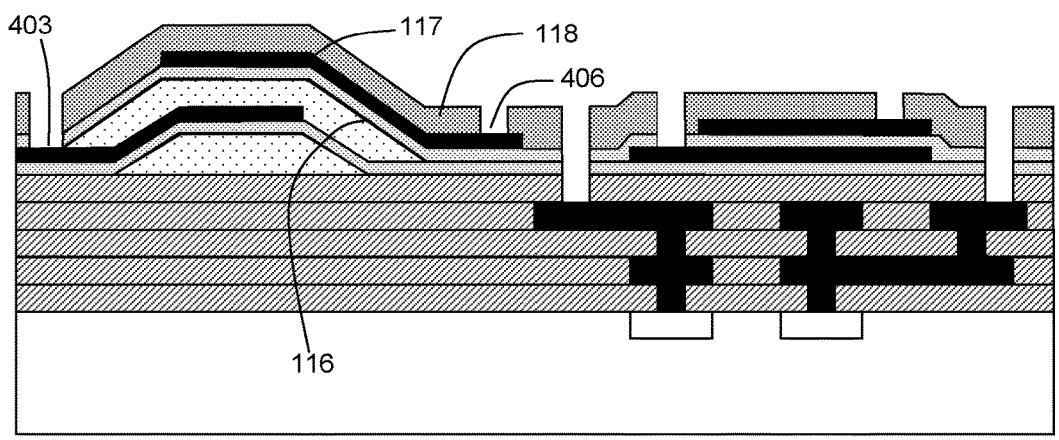

As illustrated in FIG. 4e, a further back-plate layer 118 may then be deposited to encapsulate the back-plate electrode 117. The further back-plate layer 118 may comprise the same material as the first back-plate layer 116, e.g. silicon nitride and may be deposited to a thickness of about 1-5 µm. Following this deposition step, as shown in FIG. 4e, etching is to expose the contact pads 403 and 406 of the membrane electrode layer and backplate electrode layer respectively, as well as exposing both capacitor plates 203a and 203b and contact CMOS layers of the CMOS circuitry.

Figure 4F:
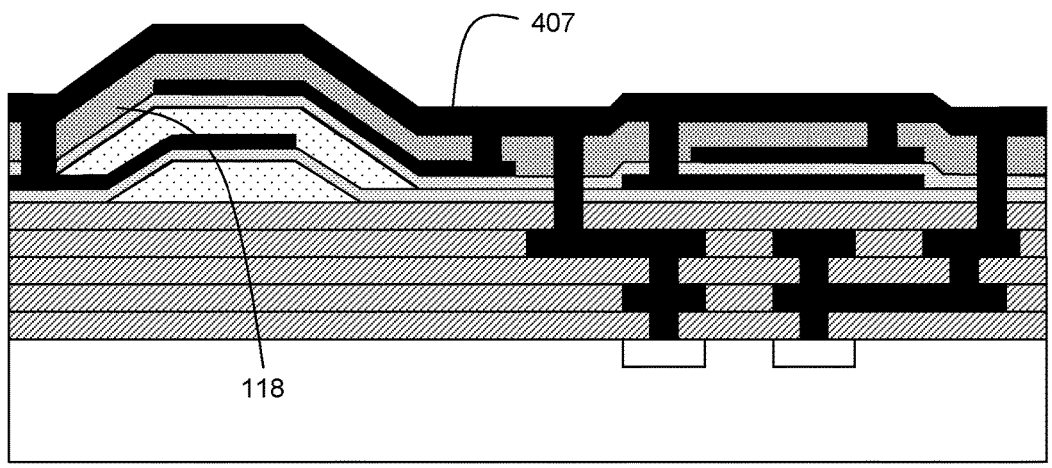
Figure 4G:
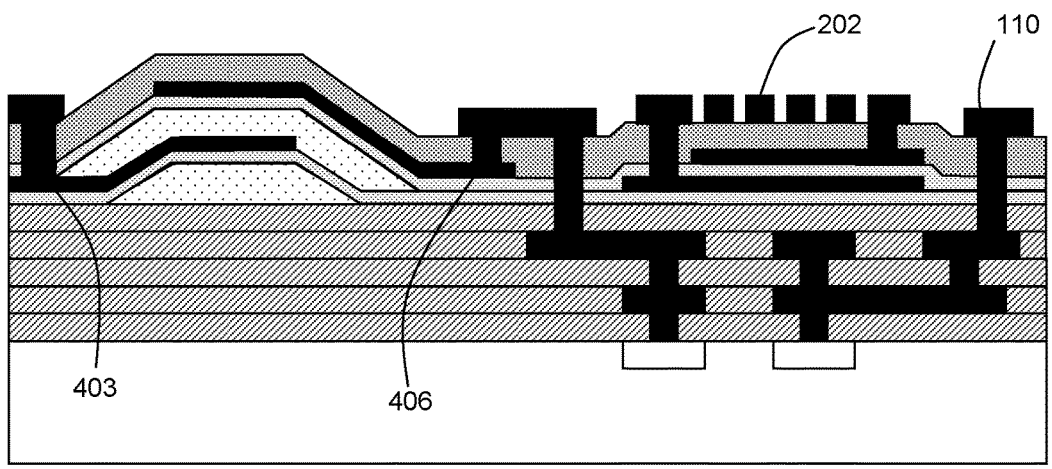
Figure 4H:
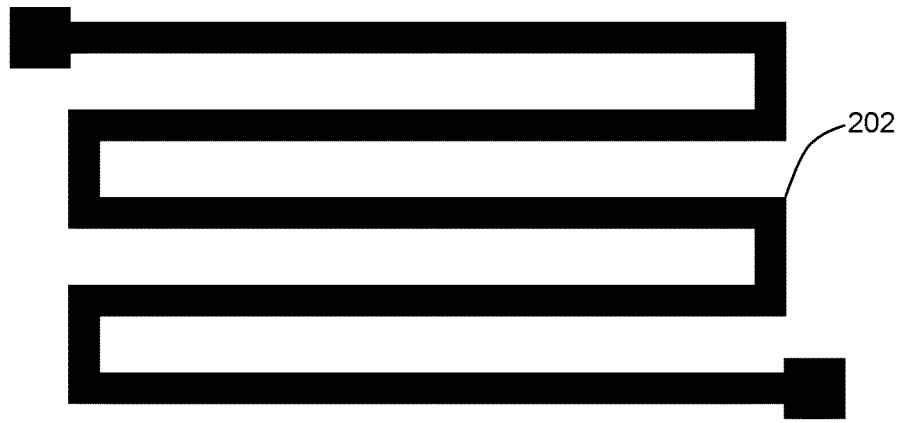

As shown in FIG. 4f a third MEMS metal layer 407 may be deposited on top of the further back-plate layer 118 and to, at least partly fill the opening described above. In some embodiments the openings may be arranged as via holes that can be filled with suitable material to form vias prior to depositing the third MEMS metal layer as discussed below. However in some embodiments the openings may be sized such that deposition of the third MEMS metal layer 407 is sufficient to provide good contact with the exposed metal layers. The third MEMS metal layer 407 may then be patterned as shown in FIG. 4g to form interconnects between the contact pads 403 and 406 and the CMOS circuitry and to also form the bond pads 110. The third MEMS metal layer is also patterned to form a resistor 202 which is part of the filter circuitry 102. The resistor 202 is effectively a relatively long conductive path formed from the third MEMS metal layer which may, for example, describe a serpentine path to extend the effective length of the conductive path and hence the overall resistance. FIG. 4h shows a plan view of an example of a serpentine path for resistor 202. The third MEMS metal layer is provided to form electrical connections and may be thicker than the first and second MEMS metal layers. In some embodiments the third MEMS metal layer may be of the order of 1 µm thick.

Following patterning of the third MEMS metal layer (and referring back to FIG. 2) at least one additional dielectric layer 121 may be deposited as a passivation layer and/or further structural backplate layer. The additional dielectric layer 121 may comprise the same material, e.g. silicon nitride, as the other back-plate layers but different materials may be used if desired. The use of different material layers can be used to control the properties of the back-plate and provide desired stress characteristics to the back-plate. The back plate layers 116 and 118 together with additional layer 121 should be thick enough to provide a stiff back-plate that will not substantially flex under acoustic (or mechanical) pressure.

The at least one additional dielectric layer 121 may then be patterned to form acoustic channels 122 through the back-plate of the MEMS transducer and also to expose bond pads 110 for external connections with the transducer die, i.e. signal out contacts, power in contacts, connections for testing etc.

Subsequently, a through hole etch may conducted in the area under the transducer from the back-side of substrate 105. As mentioned above the first layer of sacrificial material 401 can act as an etch stop to the through hole etch and therefore no separate etch stop layer is required. The first layer of sacrificial material 401 is also removed. The sacrificial layer 404 is also removed, for example via etching through the acoustic channels to leave the transducer die illustrated in FIG. 2.

As mentioned above this transducer die illustrated in FIG. 2 thus can be advantageously produced using the same material and number of layers that would be used in the absence of the filter circuit. Thus the changes to the process are requirements for different mask patterns. Also as mentioned above locating the filter circuit 201 in the first area of the transducer die 103 means that substantially no or indeed no additional die area is required that includes such filter circuitry as compared to a die without such filter circuitry.

Conveniently the lower capacitor plate 203b is the plate connected to ground, e.g. via a suitable conductive path to the ground terminal of the transducer die. Connecting the lower capacitor plate 203b to ground provides additional shielding for the underlying CMOS circuitry. Conveniently the first MEMS metal layer, which forms the membrane electrode layer 115 (which in this example forms the bottom, i.e. lower, electrode of the MEMS transducer structure), may be patterned to form one or more capacitor plates 203b that cover a majority or substantially all of the first area 103 of the transducer die and thus provide significant shielding for the underlying CMOS circuitry. In other words the majority of the first area 103 overlying the plurality of transistors is provided with the first metal layer so that the majority of the area of the first circuitry is shielded.

As mentioned, if the filter circuit comprise a resistor then preferably the third MEMS metal layer is used to form such a resistor.

It will be appreciated however that in some instances one or more additional layers could be provided specifically for the filter circuit in addition to layers of the MEMS transducer structure. For example either one or both of the capacitor plates 203a and 203b could be formed using metal layers which are deposited separately from the metal layers used to produce the electrodes 115 and 117 respectively. For example the lower capacitor plate of the filter circuit could be formed from an additional metal layer and the top plate could be formed from the membrane electrode layer. Alternatively the lower capacitor plate of the filter circuit could be formed from the backplate electrode layer and the top plate could be formed from an additional metal layer.

It will also be appreciated that the resistor 202 could be produced from the deposition of an additional metal layer or in some embodiments the first or second MEMS metal layers may be used to form a resistor.

It will of course be appreciated that FIG. 2 and FIGS. 4a-4g illustrate one particular example of a MEMS transducer structure and other types of MEMS transducer structure may be produced. For example in some embodiments the backplate may be formed below the membrane or there may be a double backplate structure. In some embodiments the membrane electrode may be supported on the underside of the membrane or sandwiched in the middle of at least two membrane layers. One skilled in the art will be aware of a number of different MEMS transducer structures. In some embodiments multiple MEMS transducer structures, which may or may not have the same functionality as one another, may be formed on the same die, each with associated electronic circuitry. In general though the various MEMS transducer structures will be formed, at least partly, from a second plurality of layers that are separate from the first plurality of layers forming the CMOS circuitry and the second plurality of layers will comprise metal layers that can be used to form at least part of a filter circuit.

It will also be appreciated that typically multiple dies are produced on a single wafer before being separated into individual dies, e.g. singulated. The steps described above may therefore in practice be performed in parallel on several die regions of a semiconductor wafer. At least some steps however may be performed after singulation, for instance the sacrificial material may only be removed after the wafer has been diced to help protect the membrane during the dicing/singulation process.

In some embodiments there may be additional filter circuits and/or at least some signal paths may be provided without any filtering.

Figure 5:
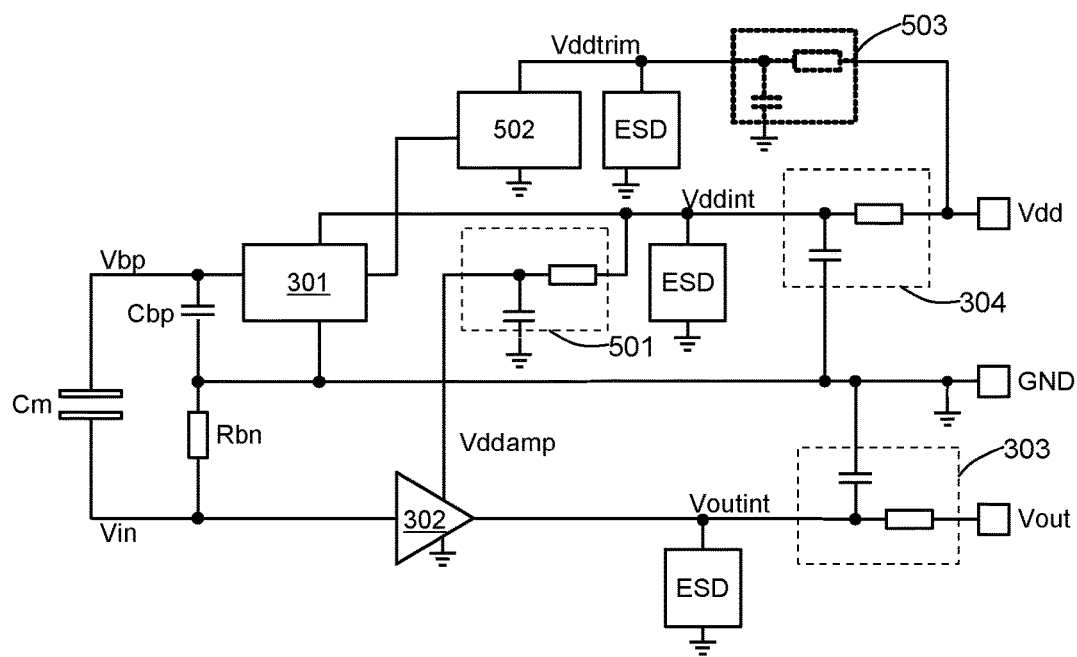
FIG. 5 illustrates a circuit diagram of a MEMS transducer die according to a further embodiment of the invention.

FIG. 5 illustrates an example circuit diagram of a transducer die according to another embodiment of the invention, in which similar components to those illustrated in FIG. 3 are identified by the same reference numerals.

In this embodiment an additional (e.g. third) filter circuit 501 is provided between the voltage supply input of the amplifier 302 and the output of the second filter circuit 304 which filters the supply voltage $V_{dd}$. This additional filter circuit 501 may similarly comprise a resistive and capacitive component wherein the resistor is connected in series in the relevant path, and the capacitor is connected between the relevant path and ground. This additional filter circuit 501 may be provided so as to provide further filtering of the supply voltage $V_{dd}$ for the amplifier 302. The amplifier 302 may be especially sensitive to RF coupling and thus a greater degree of filtering than is required or appropriate for the charge pump circuit 301 may be employed by using the first RC filter circuit 303 to provide initial filtering and the additional filter circuit 501 just for the supply for the amplifier 302.

Additionally or alternatively the transducer die may comprise a trim block 502, i.e. trimming circuit, which is connected to an input of the charge pump CP. The Trim block 502 is used for trimming or adjusting the bias voltage, e.g. the voltage generated by the charge pump, which in turn effectively trims or adjusts the sensitivity of the MEMS transducer in use. In some embodiments the trim block 502 is thus effectively a calibration block and may for instance comprise an array of programmable fuses that may be programmed during a factory calibration process. Programming such a programmable trim block may require a relatively high current pulse to blow the relevant fuses. If the signal into the trimming block 502 was filtered in a similar manner to the input of the charge pump 301, the high current pulses may be blocked by the large resistor. Therefore, in some embodiments an input to the trim block may be tapped from the supply input before the second RC filter circuit 304. In some embodiments a fourth filter circuit 503 may be provided prior to the input of the trim block where the filter circuit 503 is designed to provide less filtering than the second RC filter circuit 304. In some embodiments no filtering may be applied to the input of the trim block at all.

It should be noted that in some embodiments the transducer die may additionally comprise one or more electrostatic discharge (ESD) protection circuits. Such ESD circuits are in addition to and separate from the first circuitry.

Figure 6:
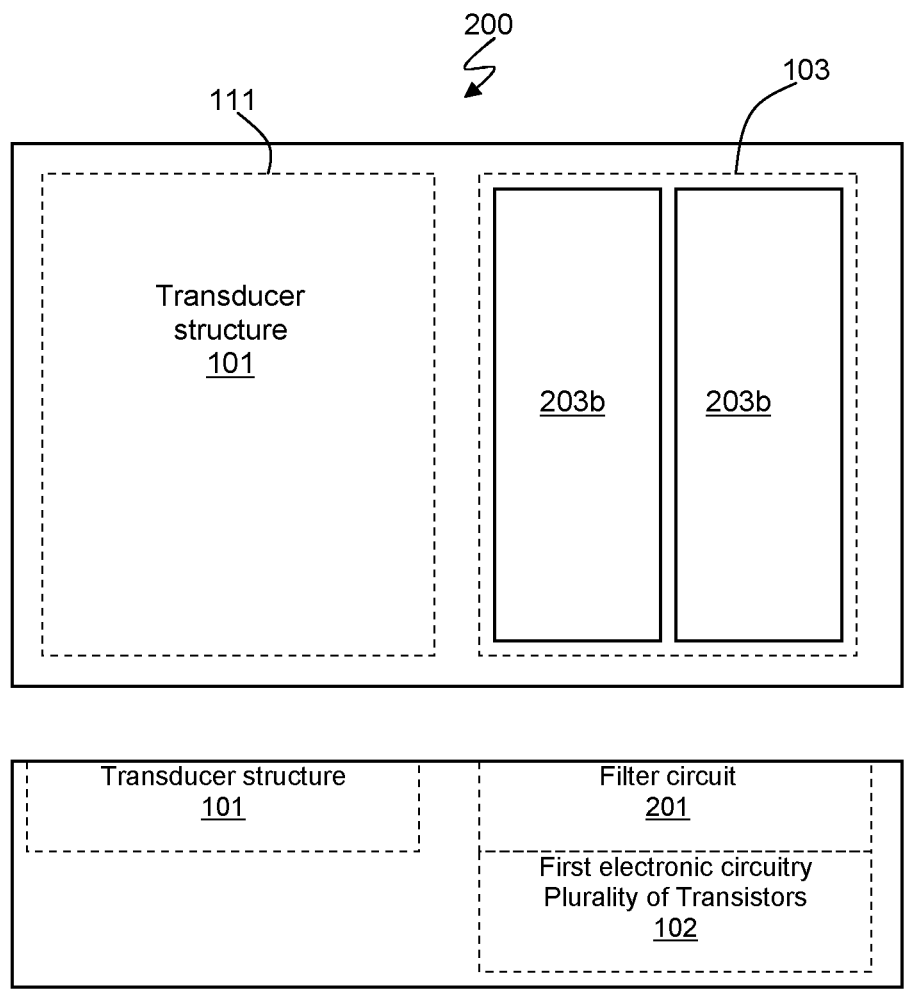
FIG. 6 illustrates in general form the layout of a transducer according to an embodiment of the invention in plan and sectional views.

FIG. 6 illustrates a schematic of the general layout or arrangement of a transducer die according to an embodiment of the invention. FIG. 6 illustrates both a plan view (top) of the transducer die 200 and a sectional view. As described previously a transducer structure 101 is formed in the second area 111 of the die and the filter circuit 201 is formed in the first area 103 of the die above the plurality of transistors of the first circuitry 102.

FIG. 6 also illustrates that the grounded lower capacitor plate(s) 203b of the capacitor(s) of the filter circuit may be arranged to cover the majority or substantially all of the first area 103 to provide shielding for the underlying circuitry.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single processor or other unit may fulfil the functions of several units recited in the claims. Any reference signs in the claims shall not be construed so as to limit their scope.

The invention claimed is:

1. A MEMS transducer die comprising:
   first circuitry comprising a plurality of transistors and their interconnections formed in a first area of the die from a first plurality of layers;
   a MEMS transducer structure formed in a second area of the die, the MEMS transducer structure being formed at least partly from a second plurality of layers which are separate to the first plurality of layers, the second plurality of layers comprising at least a first metal layer; and
   at least one filter circuit formed from said second plurality of layers overlying said plurality of transistors;
   wherein:

said first metal layer is patterned to form a first electrode of the MEMS transducer and at least a resistor, capacitor electrode or inductor element of the filter circuit; and said first circuitry comprises an amplifier circuit and wherein the filter circuit comprises a first filter network connected in a conductive path between an output terminal of the die and an output of said amplifier circuit.

2. A MEMS transducer die as claimed in claim 1 wherein the second plurality of layers further comprises a second metal layer, wherein said second metal layer is patterned to form a second electrode of the MEMS transducer and at least a part of the filter circuit.

3. A MEMS transducer die as claimed in claim 1 wherein the second plurality of layers further comprises a third metal layer, wherein said third metal layer is patterned to form at least part of a conductive path between an electrode of the MEMS transducer and the first circuitry and is also patterned to form at least a part of the filter circuit.

4. A MEMS transducer die as claimed in claim 1 wherein the second plurality of layers further comprises at least one layer that acts as an insulator for the transducer structure in the second area of the die and an insulator for the filter circuit in the first area of the die.

5. A MEMS transducer die as claimed in claim 1 wherein the filter circuit comprises a capacitor and wherein the second plurality of layers comprises at least a first dielectric layer which forms part of the transducer structure in the second area of the die and at least part of a dielectric of said capacitor of the filter circuit in the first area of the die.

6. A MEMS transducer die as claimed in claim 1 comprising a cavity in said first plurality of layers in the second area to provide at least part of an acoustic volume for said MEMS transducer.

7. A MEMS transducer die as claimed in claim 1 wherein the filter circuit comprises a resistive-capacitive filter.

8. A MEMS transducer die as claimed in claim 1 wherein the filter circuit comprises a second filter network connected in a conductive path between a voltage supply terminal to the die and a first input of the first circuitry.

9. A MEMS transducer die as claimed in claim 8 wherein the filter circuit comprises a third filter network connected in a conductive path between the output of the second filter network and a second input of the first circuitry.

10. A MEMS transducer die as claimed in claim 9 wherein said first circuitry comprises biasing circuitry and said first input of the first circuitry is a supply input to said biasing circuitry and wherein said second input of the first circuitry is a supply input to said amplifier circuit.

11. A MEMS transducer die as claimed in claim 8 wherein the transducer die comprises a conductive path between said voltage supply terminal to the die and a third input of the first circuitry which does not include said second filter circuit.

12. A MEMS transducer die as claimed in claim 11 wherein said first circuitry comprises a trimming circuit for trimming a bias voltage and said third input of the first circuitry is a supply input to said trimming circuit.

13. A MEMS transducer die as claimed in claim 11 wherein the filter circuit comprises a fourth filter network connected in said conductive path between said voltage supply terminal and said third input of the first circuitry, wherein said fourth filter network is configured to provide less filtering than said second filter network.

14. A MEMS transducer die as claimed in claim 1 wherein the filter circuit comprises a resistor and wherein said resistor comprises a conductive path with a serpentine configuration.

15. An electronic device comprising a MEMS transducer die as claimed in claim 1 wherein said device is at least one of: a portable device; a battery powered device; a computing device; a communications device; a gaming device; a mobile telephone; a personal media player; a laptop, tablet or notebook computing device.

16. A MEMS transducer die comprising:
first circuitry comprising a plurality of transistors and their interconnections formed in a first area of the die from a first plurality of layers;
a MEMS transducer structure formed in a second area of the die, the MEMS transducer structure being formed at least partly from a second plurality of layers which are separate to the first plurality of layers, the second plurality of layers comprising at least a first metal layer; and
at least one filter circuit formed from said second plurality of layers overlying said plurality of transistors;
wherein:
said first metal layer is patterned to form a first electrode of the MEMS transducer and at least a resistor, capacitor electrode or inductor element of the filter circuit; and
the filter circuit comprises at least one capacitor and wherein the first metal layer forms a first capacitor electrode for said at least one capacitor in the first area of the die.

17. A MEMS transducer die as claimed in claim 16 wherein said first capacitor electrode is connected via a conductive path to a ground terminal of said transducer die.

18. A MEMS transducer die comprising:
a first plurality of layers; and
a second plurality of layers on the first plurality of layers;
wherein the die comprises:
first circuitry comprising a plurality of transistors formed in a first area in the first plurality of layers;
filter circuitry formed in the first area in the second plurality of layers;
a transducer structure formed in a second area in the second plurality of layers; and
a cavity formed in the first plurality of layers within the second area;
wherein the second plurality of layers comprises a first metal layer that forms at least part of the filter circuitry in the first area and an electrode of the transducer structure in the second area.

19. A monolithic semiconductor die comprising:
first and second areas;
a MEMS transducer formed within said first area comprising a plurality of layers;
electronic circuitry coupled to said MEMS transducer and formed within said second area; and
filter circuitry coupled to said electronic circuitry and formed above said electronic circuitry;
wherein said filter circuitry comprises said at least one layer from said plurality of layers.

* * * * *